United States Patent [19]

Lane et al.

[11] Patent Number: 5,895,274
[45] Date of Patent: Apr. 20, 1999

[54] HIGH-PRESSURE ANNEAL PROCESS FOR INTEGRATED CIRCUITS

[75] Inventors: Richard Lane; Phillip G. Wald, both of Boise, Id.

[73] Assignee: Micron Technology, Inc., Boise, Id.

[21] Appl. No.: 08/589,852

[22] Filed: Jan. 22, 1996

[51] Int. Cl.⁶ .................................................. H01L 21/324
[52] U.S. Cl. ........................ 438/795; 438/795; 438/660; 438/663
[58] Field of Search ........................... 437/247; 438/660, 438/663, 904, 795; 257/297, 651

[56] References Cited

U.S. PATENT DOCUMENTS

| | | | |
|---|---|---|---|
| 4,154,873 | 5/1979 | Hickox et al. | 427/82 |
| 5,425,843 | 6/1995 | Saul et al. | 156/643.1 |
| 5,494,860 | 2/1996 | McDevitt et al. | 437/246 |
| 5,520,785 | 5/1996 | Evans et al. | 204/192.27 |
| 5,720,828 | 2/1998 | Strom-Olsen et al. | 148/104 |

*Primary Examiner*—Charles Bowers
*Assistant Examiner*—Thanh Nguyen
*Attorney, Agent, or Firm*—Hill Johnson & Schmutz; Angus C. Fox, III

[57] ABSTRACT

This invention embodies an improved process for annealing integrated circuits to repair fabrication-induced damage. An integrated circuit is annealed in a pressurized sealed chamber in which a forming gas comprising hydrogen is present. Pressurization of the chamber reduces the contribution made by the final anneal step to total thermal exposure by increasing the diffusion rate of the hydrogen into the materials from which the integrated circuit is fabricated. Ideally, the forming gas contains, in addition to hydrogen, at least one other gas such as nitrogen or argon that will not react with hydrogen and, thus, reduce the danger of explosion. However, the integrated circuit may be annealed in an ambiance containing only hydrogen gas that is maintained at a pressure greater than ambient atmospheric pressure.

22 Claims, No Drawings

HIGH-PRESSURE ANNEAL PROCESS FOR INTEGRATED CIRCUITS

BACKGROUND OF THE INVENTION

1. Field of the Invention

This invention relates to annealing processes used to repair process-induced damage in integrated circuits.

2. Description of Related Art

Integrated circuit devices are typically fabricated in mass on silicon wafers. During the fabrication process, a semiconductor wafer is transformed into a multitude of integrated circuits by subjecting it to numerous ordered steps, which may include coating with photoresist resin, exposure of the photoresist to electromagnetic radiation using a reticle affixed to a highly-precise stepper device, development of the photoresist to form a mask, oxidation, nitridization, silicidation, wet etching, plasma etching, chemical vapor deposition, plasma-enhanced chemical vapor deposition, sputter deposition, ion implants, annealing steps for activating and driving implanted ions. A number of these steps create residual damage to the material being treated. For example, plasma etches typically leave dangling silicon bonds. In such a case, the silicon surface exposed to the etch comprises many silicon atoms with unfilled orbitals. Another example is the crystal damage wrought by ion implants. It is axiomatic that the larger the implanted ion, the greater the crystal damage. Arsenic, a relatively large ion, is particularly adept at damaging the silicon crystal structure when implanted. Plasma-enhanced chemical vapor deposition processes can also create damage similar to that caused by plasma etches. In addition, silicon dioxide deposited using plasma-enhanced chemical vapor deposition processes tends to trap electrons. The charge buildup resulting from trapped electrons can shift threshold voltage values in field-effect transistors to the point where they will not fully shut off. Unwanted current leakage through the transistors results.

Following fabrication, but before encapsulation or other packaging steps, the wafers are annealed at temperatures of about 400° C. in a forming gas containing diatomic hydrogen for approximately 30 minutes in order to repair the damage caused by the various process steps. Generally, the forming gas contains both diatomic hydrogen and diatomic nitrogen gases. The partial pressure of hydrogen within the forming gas is usually about 20 percent of the total pressure. At anneal temperatures nitrogen functions as an inert gas, as it does not react with either hydrogen or the materials from which the circuits were fabricated within this temperature range. Although other inert gases such as helium, neon or argon may be used as components of the forming gas, nitrogen is used primarily for cost considerations. In addition, although forming gases having higher concentrations of hydrogen or even pure hydrogen could be used for the final anneal ambiance, safety concerns dictate that hydrogen be diluted to a partial pressure of around 20 percent of the total pressure. At elevated temperatures, silicon crystals damaged by implanted ions tend to heal themselves. Although the healing process may be less than perfect, a significant reduction in transistor leakage is observed. During the anneal, the hydrogen gas molecules, on account of their small size, are able to diffuse throughout the circuit and react with any dangling bonds that are present. Dangling bonds may be present on silicon atoms in substrate regions which have been plasma etched, in polycrystalline silicon layers which have been plasma etched, and in silicon atoms in silicon dioxide layers which have been formed using plasma-enhanced chemical vapor deposition. The diffusion of hydrogen throughout the oxide layers dissipates trapped charges and enhances circuit performance.

During the fabrication process, an integrated circuit is subjected on numerous occasions to elevated temperature. Generally, the elevated temperature is required to effect a necessary step in the fabrication process. For example, oxidation of silicon, implant activations, and chemical vapor deposition of silicon dioxides are generally performed at temperatures in excess of 500 degrees centigrade. Metalization steps are also performed at high temperatures. Although a certain amount of exposure to elevated temperatures is required both to activate implanted ions and to cause them to diffuse within the implanted material, too much exposure to elevated temperature will effect too great an overlap and counterdoping of adjacent implants having opposite conductivity types and cause source/drain regions of field-effect transistors to diffuse too far into the channel regions. Outdiffusion of dopants into the channel regions is irreversible, and will result in transistor leakage. Greater outdiffusion will, at some point, completely destroy the functionality of the circuit. The exposure of integrated circuits to heat is analogous in two respects to the exposure of living organisms to ionizing radiation. Not only is exposure cumulative, but at some exposure level, the organism will die. Each integrated circuit device has an optimum total thermal exposure limit that is generally referred to as the circuit's thermal budget. The budget is calculated by summing all exposures with regard to both time and temperature. Although time is a linear function, diffusion rate does not increase in direct proportion to the increase in temperature. Instead, the diffusion rate increases geometrically with increasing temperature.

As device geometries are shrunk for new generations of integrated circuits, thermal budgets must be lowered by a corresponding amount. Unless the process is modified to reflect these reduced thermal budgets, it will become increasingly difficult to stay within those budgets. It is a given that final anneals in a hydrogen-containing ambiance for extended periods will become increasing problematic in terms of thermal budget considerations as device dimensions shrink.

Silicon nitride films are used extensively as moisture barriers in integrated circuits. Silicon nitride films are also nearly impermeable to diatomic hydrogen molecules at standard temperature and pressure. This has not posed a problem until fairly recently, as the silicon nitride film is deposited as the final layer in the fabrication process. The hydrogen anneal step is performed prior to depositing the final silicon nitride film. However, silicon nitride films are also being used with increasing frequency for sidewall spacers and capping layers on field-effect transistor gates when self-aligned contact etches which are required for sub-half-micron geometries. These silicon nitride gate structures must be fabricated long before the hydrogen anneal step. The presence of these silicon nitride structures greatly hampers the diffusion of hydrogen molecules into silicon dioxide layers associated with the transistor gates.

Therefore, a new final thermal anneal process is needed that is more compatible with the limited thermal budgets and the silicon nitride gate structures associated with the new generations of integrated circuits.

SUMMARY OF THE INVENTION

This invention embodies an improved process for annealing integrated circuits to repair fabrication-induced damage.

An integrated circuit is annealed in a pressurized sealed chamber in which a forming gas containing hydrogen is present. Pressurization of the chamber reduces the contribution made by this final anneal step to total thermal exposure by increasing the diffusion rate of the hydrogen into the materials from which the integrated circuit is fabricated. Ideally, the forming gas contains, in addition to hydrogen, at least one other gas such as nitrogen or argon that will not react with hydrogen and, thus, reduce the danger of explosion. However, the integrated circuit may be annealed in an ambiance containing only hydrogen gas that is maintained at a pressure greater than the prevailing ambient atmospheric pressure. Typical anneal temperatures are within a range of 300 to 500° C. for circuits having aluminum metalization. Higher upper temperature limits and shorter anneal times may be used for circuits employing metalization materials with higher melting points than that of aluminum. Although the efficiency of anneal operations improves by increasing the annealing pressure above 1 atmosphere, optimum annealing pressures are deemed to be in the 10 to 25 atmosphere range.

PREFERRED EMBODIMENT OF THE INVENTION

The improved final anneal process, which takes place before the integrated circuit devices are encapsulated, utilizes forming gas under high pressure to increase the diffusion rate of diatomic hydrogen within the materials from which the integrated circuits are manufactured. By performing the anneal under pressure and increasing the diffusion rate of diatomic hydrogen, the temperature or the duration or both the temperature and the duration of the anneal process may be reduced. Furthermore, by increasing pressure, anneal operations which were previously impractical due to impermeability of certain materials such as silicon nitride become workable.

The improved final anneal takes place in a sealable anneal chamber in which a forming gas comprising hydrogen is present. In a preferred embodiment of the process, the forming gas contains both diatomic hydrogen and diatomic nitrogen gases. Due to safety considerations, the optimum partial pressure of hydrogen within the forming gas is about 20 percent of the total pressure. If the safety concerns are mitagable, greater partial pressures of hydrogen up to 100 percent of the total pressure may be employed. In addition, the forming gas may comprise one or more of other inert gases such as helium, neon and argon. The forming gas within the anneal chamber is pressurized above ambient atmospheric pressure. Although equipment limitations will restrict maximum pressures, process equipment that will handle pressures up to 10 atmospheres is generally available. It is believed that even greater pressures up to 25 atmospheres will further increase the diffusion rate of hydrogen within the materials from which the integrated circuits are fabricated and enable the use of lower anneal temperatures and/or shorter anneal periods. Additionally, it will make practical the hydrogen anneal of circuits having silicon nitride structures surrounding gate structures. In order to reduce the contribution made by this improved final anneal step to total thermal exposure, either the anneal temperature or the anneal duration is reduced. Alternately, both the anneal temperature and the anneal duration can be reduced. Typical anneal temperatures are within a range of 300 to 500° C. for circuits having aluminum metalization, with the optimum anneal temperature being about 400° C. Higher upper temperature limits with correspondingly shorter anneal times may be used for circuits employing metalization materials with higher melting points than that of aluminum. Typically, the anneal temperature is no greater than 80 percent of the melting point of the metal or metal alloy utilized for the metalization.

Although only several embodiments of the improved anneal process are disclosed herein, it will be obvious to those having ordinary skill in the art of integrated circuit manufacture, that changes and modifications may be made thereto without departing from the scope and the spirit of the invention as hereinafter claimed.

We claim:

1. A process for annealing an integrated circuit fabricated on a silicon substrate and having silicon dioxide dielectric layers in order to repair fabrication-induced damage to the substrate and eliminate trapped charges in the silicon dioxide layers, said process comprising the steps of:
   (a) placing the circuit within a sealable chamber;
   (b) introducing a forming gas comprising hydrogen into the chamber, said forming gas being pressurized within the chamber to greater than ambient atmospheric pressure; and
   (c) elevating the temperature of the integrated circuit to a temperature within a range of about 300° C. to 475° C. for a period sufficient to complete the anneal.

2. The process of claim 1, wherein the forming gas also comprises at least one inert gas.

3. The process of claim 2, wherein said at least one inert gas is selected from the group consisting of nitrogen, helium, neon, and argon.

4. The process of claim 1, wherein the forming gas also comprises nitrogen.

5. The process of claim 1, wherein said forming gas is pressurized to a pressure of about 10 atmospheres.

6. The process of claim 1, wherein the temperature is elevated to about 400° C.

7. A process for annealing an integrated circuit fabricated on a silicon substrate in order to repair fabrication-induced damage to the substrate, said circuit having metal alloy conductor lines, said process comprising the steps of:
   (a) placing the circuit within a sealable chamber;
   (b) pressurizing the chamber with a forming gas comprising hydrogen to a pressure greater than ambient atmospheric pressure; and
   (c) elevating the temperature of the integrated circuit to a temperature no greater than 80 percent of the melting point of the metal alloy for a period sufficient to complete the anneal.

8. The process of claim 7, wherein the forming gas also comprises at least one inert gas.

9. The process of claim 8, wherein said at least one inert gas is selected from the group consisting of nitrogen, helium, neon, and argon.

10. The process of claim 7, wherein the forming gas also comprises nitrogen.

11. The process of claim 7, wherein said forming gas is pressurized to a pressure of about 10 atmospheres.

12. The process of claim 7, wherein the metal alloy contains aluminum and the temperature is elevated to about 400° C.

13. A process for annealing an integrated circuit fabricated on a silicon substrate in order to repair fabrication-induced damage to the substrate, said circuit having metal alloy conductor lines which are predominantly aluminum, said process comprising the steps of:
   (a) placing the circuit within a sealable chamber;
   (b) introducing a forming gas comprising diatomic hydrogen into the chamber, said forming gas being pressurized within the chamber to greater than ambient atmospheric pressure; and (c) elevating the temperature of the integrated circuit to a temperature within a range of about 300° C. to 475° C. for a period sufficient to complete the anneal.

14. The process of claim 13, wherein the forming gas also comprises at least one inert gas.

15. The process of claim 14, wherein said at least one inert gas is selected from the group consisting of diatomic nitrogen, helium, neon, and argon.

16. The process of claim 13, wherein the forming gas also comprises nitrogen.

17. A process for annealing a silicon wafer to repair fabrication-induced damage to the silicon, said wafer containing a plurality of integrated circuits having metal alloy conductor lines, said process comprising the steps of:

(a) placing the wafer within a sealable chamber;

(b) pressurizing the chamber with a forming gas comprising hydrogen to a pressure greater than ambient atmospheric pressure; and (c) elevating the temperature of the wafer to a temperature no greater than 80 percent of the melting point of the metalized conductor lines for a period sufficient to complete the anneal.

18. The process of claim 17, wherein the forming gas also comprises at least one inert gas.

19. The process of claim 18, wherein said at least one inert gas is selected from the group consisting of nitrogen, helium, neon, and argon.

20. The process of claim 17, wherein the forming gas also comprises nitrogen.

21. The process of claim 17, wherein the partial pressure of hydrogen within the forming gas falls within a range of 10 to 100 percent of total forming gas pressure.

22. The process of claim 17, wherein the forming gas is comprised primarily of diatomic nitrogen and diatomic hydrogen, with diatomic nitrogen being the predominant species present.

* * * * *